United States Patent
Horisaki et al.

(10) Patent No.: US 8,176,389 B2
(45) Date of Patent: May 8, 2012

(54) DECODER DEVICE AND METHOD FOR DECODING DATA STORED IN STORAGE MEDIUM

(75) Inventors: Koji Horisaki, Yokohama (JP); Akira Yamaga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 938 days.

(21) Appl. No.: 12/132,040

(22) Filed: Jun. 3, 2008

(65) Prior Publication Data

US 2008/0301524 A1 Dec. 4, 2008

(30) Foreign Application Priority Data

Jun. 4, 2007 (JP) ................ P2007-148206

(51) Int. Cl.
*G11C 29/00* (2006.01)
(52) U.S. Cl. ................ 714/768; 714/774
(58) Field of Classification Search .......... 714/768, 714/774
See application file for complete search history.

(56) References Cited

U.S. PATENT DOCUMENTS

| | | | | |
|---|---|---|---|---|
| 5,892,896 | A * | 4/1999 | Shingo | 714/6.13 |
| 2003/0023911 | A1 * | 1/2003 | Davis et al. | 714/723 |
| 2005/0268203 | A1 * | 12/2005 | Keays et al. | 714/758 |
| 2006/0192866 | A1 * | 8/2006 | Taguchi | 348/246 |
| 2006/0285397 | A1 * | 12/2006 | Nishihara et al. | 365/185.33 |

FOREIGN PATENT DOCUMENTS

| | | |
|---|---|---|
| JP | 2003-123394 | 4/2003 |
| JP | 2004-152409 | 5/2004 |
| JP | 2006-236536 | 9/2006 |
| JP | 2007-087464 | 4/2007 |
| JP | 2007-293988 | 11/2007 |

OTHER PUBLICATIONS

Japanese Office Action corresponding to U.S. Appl. No. 12/132,040 mailed on Jul. 21, 2009.
Hassan, et al., Decoding Algorithms with Input Quantization and Maximum Error Correction Capability, IEEE Transactions on Information Theory, vol. 41, No. 4, Jul. 1995.
Korean Search Report dated Apr. 29, 2009 corresponding to U.S. Appl. No. 12/132,040, filed Jun. 3, 2008.

* cited by examiner

*Primary Examiner* — M. Mujtaba K Chaudry
(74) *Attorney, Agent, or Firm* — Turocy & Watson, LLP (57) ABSTRACT

A decoder device includes: a decoder that decodes data stored in a storage medium by performing error correction on the data, the error correction being capable of correcting code error and code erasure included in the data; a memory that stores a history of an address in the storage medium of a code included in the data, the code being detected to have the code error by the decoding unit; and a controller that controls the decoder to change a detail of the error correction based on the history stored in the memory.

12 Claims, 6 Drawing Sheets

3bit-2 WORD CODE WORD ⇒ 1bit/WORD

ERROR CORRECTABLE

FIG. 3B

3bit-4 WORD CODE WORD ⇒ 2bit/WORD

ERROR UNCORRECTABLE

IF LEFTMOST BIT IS KNOWN TO BE INVALID (ERASURE), DECODE CAN BE PERFORMED.

FIG. 4A

EXAMPLE OF ERASURE

FIG. 4B

3bit-4 WORD CODE WORD ⇒ 1bit/WORD

ERASURE CORRECTABLE

| mode | CORRECTABLE CODE ERRORS (byte) | CORRECTABLE CODE ERASURES (byte) |
|---|---|---|
| 0 | 8 | 0 |
| 1 | 7 | 1 |
| 2 | 7 | 2 |
| 3 | 6 | 3 |
| 4 | 6 | 4 |
| 5 | 5 | 5 |
| 6 | 5 | 6 |
| 7 | 4 | 7 |
| 8 | 4 | 8 |
| 9 | 3 | 9 |
| 10 | 3 | 10 |
| 11 | 2 | 11 |
| 12 | 2 | 12 |
| 13 | 1 | 13 |
| 14 | 1 | 14 |

FIG. 7

| | |
|---|---|
| #0 | MODE NUMBER |
| #1 | BYTE POSITION (ADDRESS) IN WHICH ERROR OCCURRED IN PREVIOUS READ-OUT OPERATION |
| #2 | |
| #3 | |
| #4 | |
| #5 | |
| #6 | UNUSED APPROPRIATELY |
| #7 | |
| #8 | |
| #9 | |
| #10 | ERASURE BYTE POSITION (ADDRESS) |
| #11 | |
| #12 | |
| #13 | |
| #14 | |
| #15 | |

1~#{(15-N)÷2}

(16-N)~#15

14'

DECODER DEVICE AND METHOD FOR DECODING DATA STORED IN STORAGE MEDIUM

RELATED APPLICATION(S)

The present disclosure relates to the subject matter contained in Japanese Patent Application No. 2007-148206 filed on Jun. 4, 2007, which is incorporated herein by reference in its entirety.

FIELD

The present invention relates to a decoder device and a method for decoding data including an error correction code (ECC).

BACKGROUND

Generally, a storage medium, such as a NAND-type flash memory, has a characteristic that the number of defective cells increases due to aged deterioration of the storage medium. The increase of the number of defective cells causes the number of code errors to be increased. As a technique for solving such problem, there is proposed a decoder device that decodes data using an error correction code. The error correction code is used for determining a position of a defective bit (i.e. defective cell) in the data to be decoded, which is formed by several bits, and for performing a correction of the defective bit.

However, by configuring the error correction code to have a high correction capability under any circumstance to increase allowable number of defective cells, decoding process becomes complex, and amount of calculation increases. Accordingly, allowable number of defective cells, that is, the error correcting capability is set based on the importance of the data to be decoded and/or the processing power of the decoder device. Accordingly, in a case where the error correction code is designed to allow two defective cells, errors occurred to three or more bits in the data could not be appropriately corrected.

There is proposed a decoder device that performs an error correction using an erasure correction code. The erasure correction code is for restoring invalid data in the data to be decoded having several bits by using remaining valid data. An example of such decoder device is disclosed in JP-A-2006-236536 (counterpart U.S. publication is: US 2006/0192866 A1). However, the decoder device disclosed in JP-A-2006-236536 has low tolerance for a rapid increase of defective cells (errors).

SUMMARY

According to a first aspect of the invention, there is provided a decoder device including: a decoder that decodes data stored in a storage medium by performing error correction on the data, the error correction being capable of correcting code error and code erasure included in the data; a memory that stores a history of an address in the storage medium of a code included in the data, the code being detected to have the code error by the decoding unit; and a controller that controls the decoder to change a detail of the error correction based on the history stored in the memory.

According to a second aspect of the invention, there is provided a method for decoding data stored in a storage medium, the method including: decoding the data stored in the storage medium by performing error correction on the data, the error correction being capable of correcting code error and code erasure included in the data; storing a history of an address in the storage medium of a code included in the data, the code being detected to have the code error in the error correction; and controlling a detail of the error correction based on the stored history.

DETAILED DESCRIPTION OF THE EMBODIMENT(S)

Hereinafter, embodiments of the present invention will be described with reference to the accompanying drawings. The drawings are schematically represented, and it should be noted that the dimensions, ratios, and the like of the drawings are different from those of actual products. In addition, a part having different relationship of dimensions and/or a different ratio is included in the drawings. In particular, embodiments described below are for exemplifying a device and a method that are used for embodying the technical concept of the present invention. The technical concept of the present invention should not be determined to be limited based on the shape, structure, arrangement, and the like of components shown in the drawings. In the technical concept of the present invention, various changes can be made without departing from the scope of the claimed invention.

First Embodiment

Figure 1:
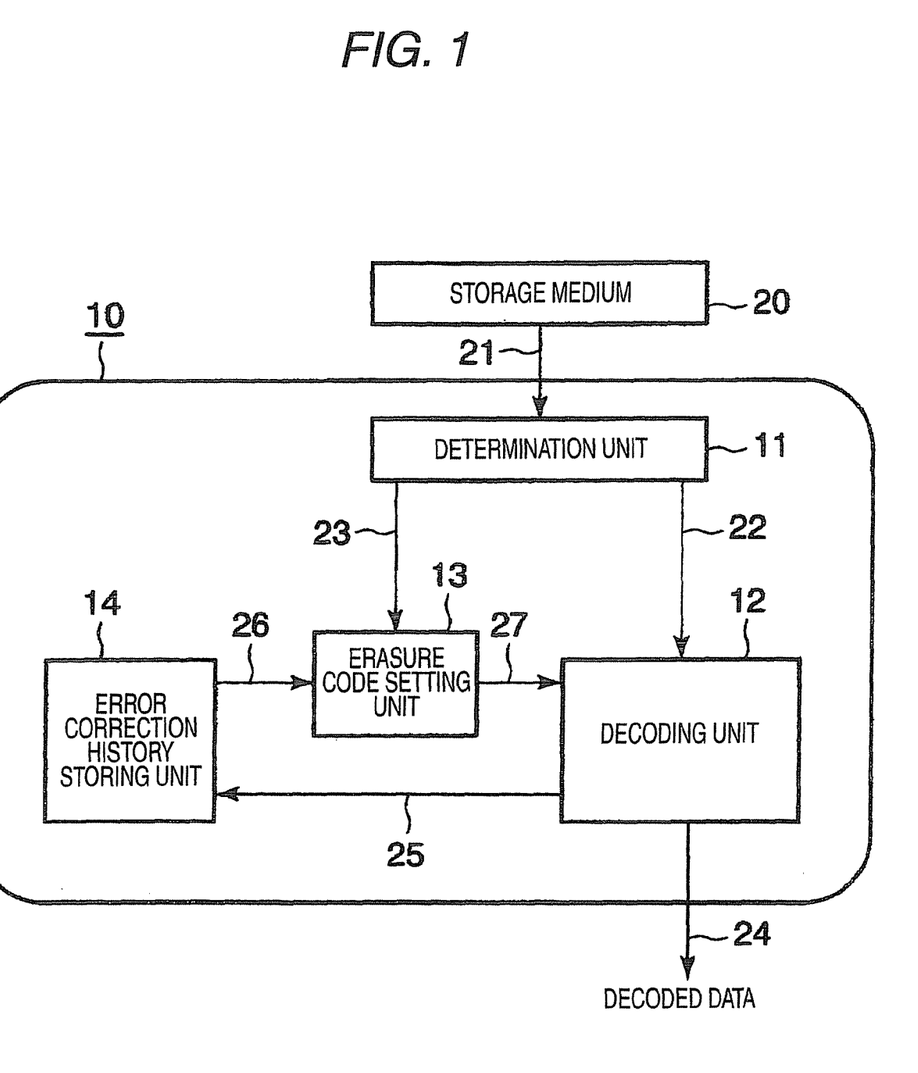
FIG. 1 is a block drawing showing an example of a configuration of a decoder device according to a first embodiment of the present invention.

FIG. 1 shows an example of a configuration of a decoder device 10 according to a first embodiment of the present invention.

As shown in FIG. 1, the decoder device 10 reads data stored in a storage medium 20, such as a NAND-type flash memory, as a readout value (for example, an analog voltage value) 21 in units of several bits and inputs the readout value 21 to a determination unit 11.

The determination unit 11 generates readout data 22, which may include a code error, based on the readout value 21 that is read out from the storage medium 20 and outputs the readout data 22 to a decoding unit 12. For example, the determination unit 11 determines the readout data 22 to be "0" when an analog voltage value of the respective bits of the readout value 21 is smaller than a threshold value. On the other hand, the determination unit 11 determines the readout data 22 to be "1" when an analog voltage value of the respective bits of the readout value 21 is larger than the threshold value.

The determination unit 11 generates supplemental information 23 that indicates an accuracy (the degree of ambiguity) of the readout data 22 and outputs the supplemental information 23 to an erasure code setting unit 13.

The supplemental information 23 indicates whether the code of each bit included in the readout data 22 is a value near to the threshold value. Generally, when a distance (difference) between the readout value 21 and the threshold value is small, the accuracy is relatively low (i.e. the degree of ambiguity is high), compared to a case where the distance is large.

When the result of determination for a code changes by slightly changing the threshold value, the code has a low accuracy. Accordingly, the supplemental information 23 may be generated by performing the determination while changing the threshold value.

The decoding unit 12 is capable for correcting code erasure and for correcting a code error. For example, the decoding unit 12 detects and corrects (decodes) a code error (defective bit) in the readout data 22 by using an error correction code and outputs the code error as a decoded data 24. The decoding unit 12 outputs, when the code error is detected, code error position data 25 to an error correction history storing unit 14.

The code error position data 25 is a data that indicates an address of a storage area provided in the storage medium 20 to which the data, which is detected to have the code error, is stored.

The error correction history storing unit 14 stores history of the address where the code error is detected based on the code error position data 25 that is input from the decoding unit 12. The error correction history storing unit 14 outputs error history data 26 that indicates the history of the address to the erasure code setting unit 13.

The erasure code setting unit 13 generates erasure information 27 based on the error history data 26 input from the error correction history storing unit 14 and outputs the erasure information 27 to the decoding unit 12. The erasure information 27 is, for example, generated based on the error history data 26 and the supplemental information 23 and indicates a position of the erasure code and the number of erasure codes in the data to be decoded by the decoding unit 12. The erasure code setting unit 13 enables the decoding unit 12 to perform erasure correction and code error correction on the readout data 22 based on the erasure information 27 in a decoding process that is subsequently performed.

Generally, when performing decoding process on data including the error correction code, amount of calculation required for the decoding process increases as the number of code errors becomes large. For example, when a decoding process having a minimum free distance of "dmin" is performed, the number of codes "t", of which error can be corrected by the decoding process, is represented by "2t+1≦dmin". Accordingly, for codes having a minimum Hamming distance is "11", code errors up to 5 bits are correctable and allowed in the decoding process. For more details, see the following related-art document:

"Decoding algorithms with input quantization and maximum error correction capability," Hassan, A., Stark, W., Information Theory, IEEE Transactions on Volume 41, Issue 4, July 1995, pages 1126-1133

Meanwhile, the number of codes "s" of correctable erasures (i.e. the number of codes of which value is not known whether it is "0" or "1", however the position thereof is known) satisfies the relationship of "2t+s+1≦dmin". In other words, for a code having a minimum Hamming distance of "11", code error correction of 4 bits and erasure correction of 2 bits can be performed, or code error correction of 2 bits and erasure correction of 6 bits can be performed, while a maximum of 10 bits of erasure correction can be realized.

When only the code error correction is performed, allowable number of defective bits is relatively small, compared to a case where the erasure correction is performed in combination with the code error correction. Accordingly, when the storage medium 20 has a characteristic in which the occurrence of code errors tends to be accumulatively increased as the number of time of usage and/or hours of usage increases, by setting the erasure information 27 based on the error history data 26 as described above, an advantage that the amount of calculation required for correction (decode process) can be reduced while ensuring the allowable number of defective bits.

Figure 2:
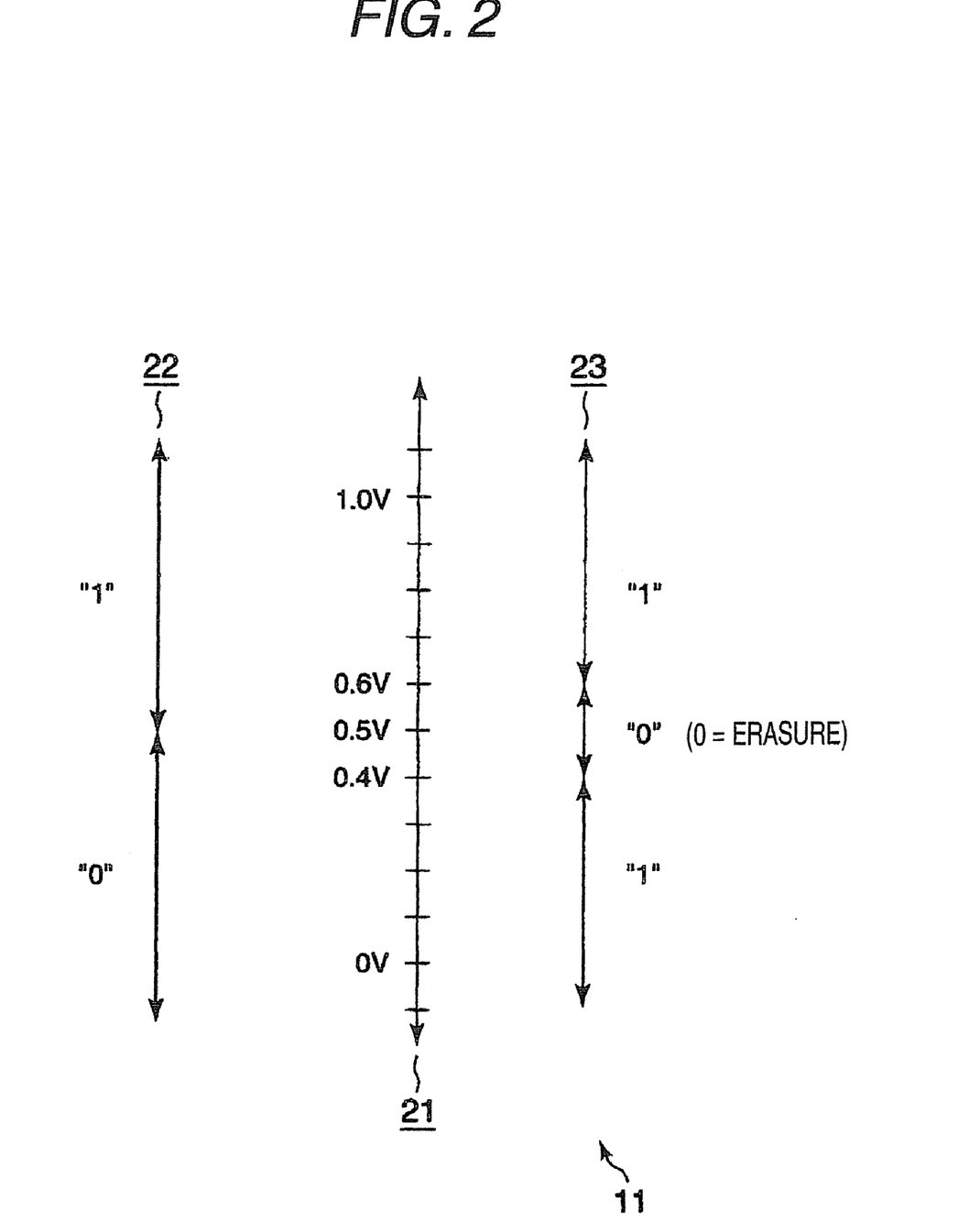
FIG. 2 is a drawing showing an operation of a determination unit of the decoder device.

FIG. 2 shows an example of an operation performed by the determination unit 11 under the above-described configuration. In the following description, it is assumed that the readout value 21 read from the storage medium 20 is an analog value that is in a range of 0 V to 1.0 V, and that a threshold value is set to 0.5 V.

For example, when the analog value of each bit of the readout value 21 is smaller than the threshold value (0.5 V), "0" is output as the readout data 22 to the decoding unit 12. On the other hand, when the analog value of each bit of the readout value 21 is larger than the threshold value (0.5 V), "1" is output as the readout data 22 to the decoding unit 12.

When the distance between the analog voltage value and the threshold value is small (for example, when the analog voltage value is in a range of 0.4 V to 0.6 V), "0 (meaning, erasure)" representing a low accuracy is output as the supplemental information 23 to the erasure code setting unit 13. Otherwise (for example, when the analog voltage value is equal to or smaller than 0.4 V or is equal to or larger than 0.6 V), "1" is output as the supplemental information 23 to the erasure code setting unit 13.

Figure 3A:
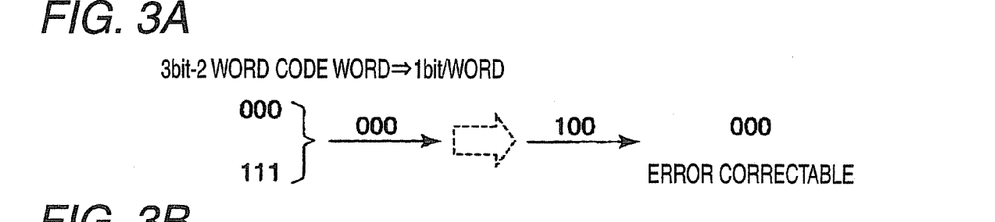
FIGS. 3A and 3B are drawings showing an operation for an error correcting process performed by an decoding unit of the decoder device.
Figure 3B:
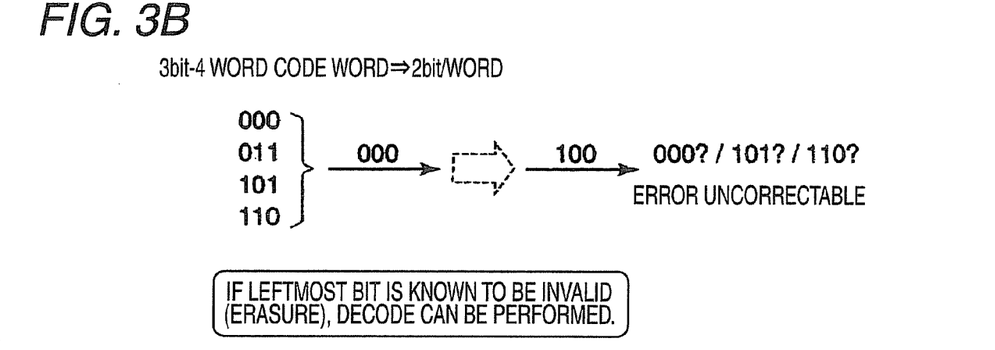

FIGS. 3A and 3B show examples of an operation of the decoding unit 12 under the above-described configuration for an error correction process. FIG. 3A shows an example in which code error correction of one bit per one word (1 bit/word) is performed for a code word of 3 bit-2 words. FIG. 3B shows an example in which code error correction of two bits per one word (2 bit/word) is performed for a code word of 3 bit-4 words.

As shown in FIG. 3A, for example, in a case where "000" and "111" are possible values for the readout value 21, even when there is a code error in the readout data 22 of "100", it is possible to correct the code error by using the error correction code for correcting the readout data to "000". In addition, when there is a code error causing readout data other than "100", the code error of one bit per one word can be corrected similarly.

On the other hand, as shown in FIG. 3B, for example, in a case where "000", "011", "101", and "110" are possible values for the readout value 21, when there is a code error in readout data 22 of "100", it can not be determined whether the code error should be corrected to "000", "101", or "110". Accordingly, the readout data cannot be corrected to "000" by using the error correction code. However, when it is known that a left-most bit among three bits is invalid (erasure), a decoding process can be performed.

Figure 4A:
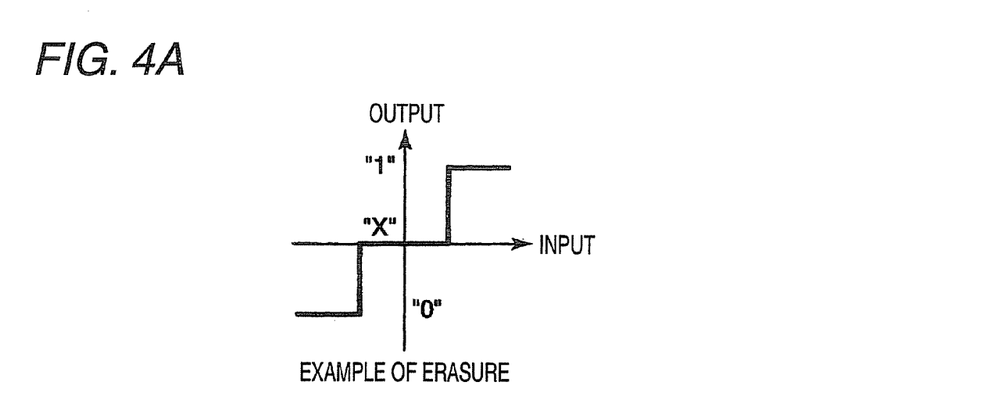
FIGS. 4A and 4B are drawings showing an operation for a erasure correction process performed by an decoding unit of the decoder device.
Figure 4B:
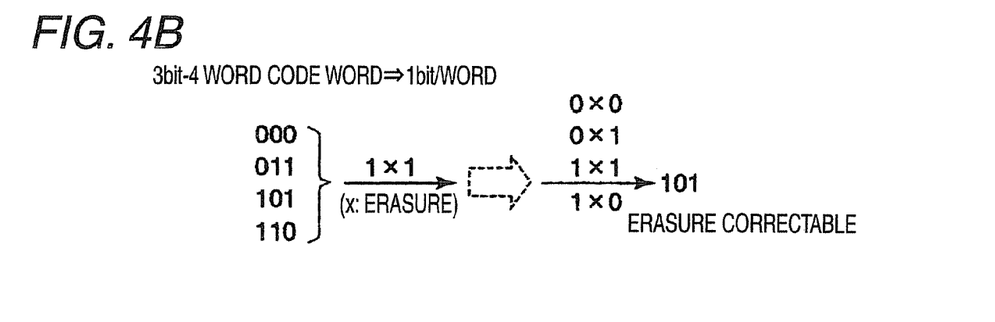

FIGS. 4A and 4B show an example of an operation of the decoding unit 12 under the above-described configuration for a erasure correction process. FIGS. 4A and 4B show an example in which erasure correction of one bit per one word (1 bit/word) is performed for a code word of 3 bit-4 words.

As shown in the figure, in a case where "000", "011", "101", and "110" are possible values for the readout value 21, when it is known that a center bit of three bits of "1X1" as the readout data 22 is invalid (where X=erasure), it is possible to correct the erasure by using the error correction code for correcting the readout data to "101". In addition, when erasure other than "1X1" occurs, erasure of one bit per one word can be corrected similarly.

In other words, "dmin (minimum free distance) −1" pieces of code erasures can be corrected by the correction process. In addition, as described above, when the relationship of "2t+s+1≦dmin" is satisfied, "s" pieces of code erasures and "t" pieces of code errors can be corrected by the correction processes. For a same code, the correctable number of code errors "t" becomes nearly twice more of the correctable number of code erasures "s" (i.e. 2t nearly equals to s).

As described above, the reproduction device using an error correction code performs a decoding process by regarding a defective cell that has a high probability in reoccurrence of a code error as a erasure in a read-out operation, as a countermeasure to aged deterioration and initial defect caused in the storage medium 20 of a NAND-type flash memory. Since a defective cell in which a code error has occurred has a high probability in reoccurrence of a code error, code error correction and erasure correction are performed for the data bit stored in the defective cell. Accordingly, allowable number of the defective cells can be increased to about twice with respect to a case where only code error correction is performed. Accordingly, it is possible to sufficiently acquire tolerance for a rapidly increasing number of defective cells while the allowable number of the defective cells is maintained.

In addition, according to the decoder device 10 thus configured, there is an additional advantage that the amount of calculation required for performing a correction process can be reduced in a case where the number of defective cells is small by reducing or omitting the erasure correction in such case.

In the decoder device 10, the decoding unit 12 serves as a decoder that decodes data stored in the storage medium 20 while performing error correction on the data, the error correction being capable of correcting code error and code erasure included in the data. The error correction history storing unit 14 serves as a memory that stores a history of an address in the storage medium 20 of a code included in the data, the code being detected to have the code error by the decoding unit. The erasure code setting unit 13 serves as a controller that controls the decoder to change a detail of the error correction based on the history stored in the memory. The determination unit 11 serves as a determination unit that determines an accuracy of each codes included in the data read out from the storage medium 20 and generates supplemental information that indicates the accuracy.

Second Embodiment

Figure 5:
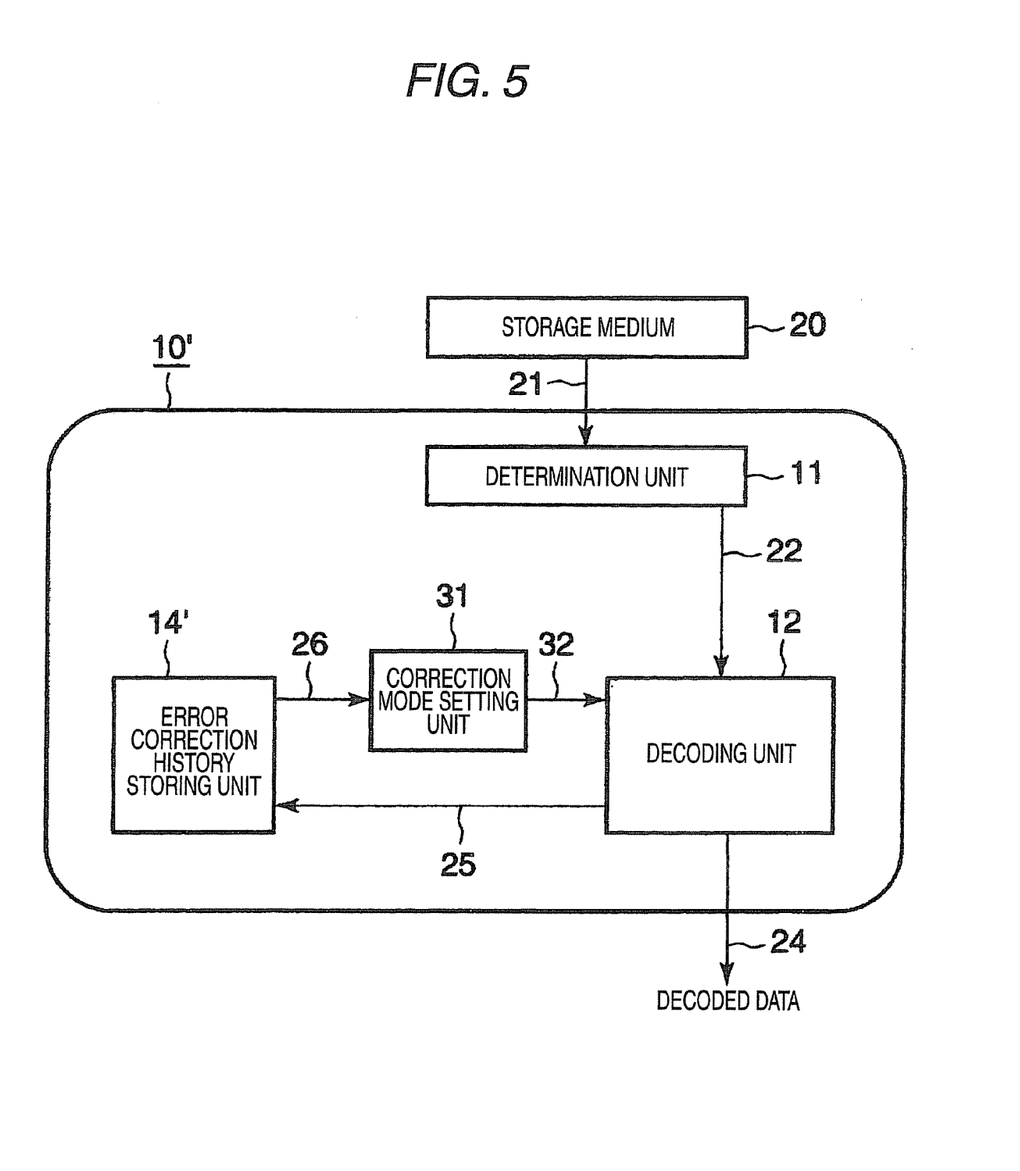
FIG. 5 is a block drawing showing an example of the configuration of a decoder device according to a second embodiment of the present invention.

FIG. 5 shows an example of a configuration of a decoder device according to a second embodiment of the present invention. Components that are substantially same to those shown in FIG. 1 is described with same reference numerals sign being assigned thereto, and the detailed description of the same components will be omitted in the following description.

As shown in FIG. 5, a decoder device 10' according to the second embodiment reads data stored in the storage medium 20, such as a NAND-type flash memory, in units of several bits and outputs the read data as a readout value (for example, an analog voltage value) 21 to the determination unit 11. The determination unit 11 generates readout data 22, which may include a code error, based on the readout value 21 and outputs the readout data 22 to the decoding unit 12.

For example, the determination unit 11 outputs "0" as the readout data 22 when an analog voltage value of a bit of the readout value 21 is smaller than a threshold value. On the other hand, the determination unit 11 outputs "1" as the readout data 22 when an analog voltage value of a bit of the readout value 21 is larger than the threshold value.

The decoding unit 12 has capability for correcting code erasure and for correcting a code error. For example, the decoding unit 12 detects and corrects (decodes) a code error (defective bit) of the readout data 22 by using an error correction code and outputs the code error as a decoded data 24. The decoding unit 12 outputs, when the code error is detected, code error position data 25 to an error correction history storing unit 14'.

The error correction history storing unit 14' stores history of the address where the code error is detected based on the code error position data 25 that is input from the decoding unit 12. The error correction history storing unit 14' outputs error history data 26, which indicates the history of the address, to a correction mode setting unit 31.

The correction mode setting unit 31 selects a correction mode 32 based on the error history data 26 output from the error correction history storing unit 14' and outputs the selected correction mode to the decoding unit 12. The correction mode 32 is, for example, determined based on the error history data 26 and indicates an operation mode for performing a correction process in accordance with a position of the erasure code and the number of erasure coded in the data to be decoded by the decoding unit 12. The correction mode setting unit 31 enables the decoding unit 12 to perform erasure correction and code error correction on the readout data 22 based on the correction mode 32 in a decoding process that is subsequently performed.

Figure 6:
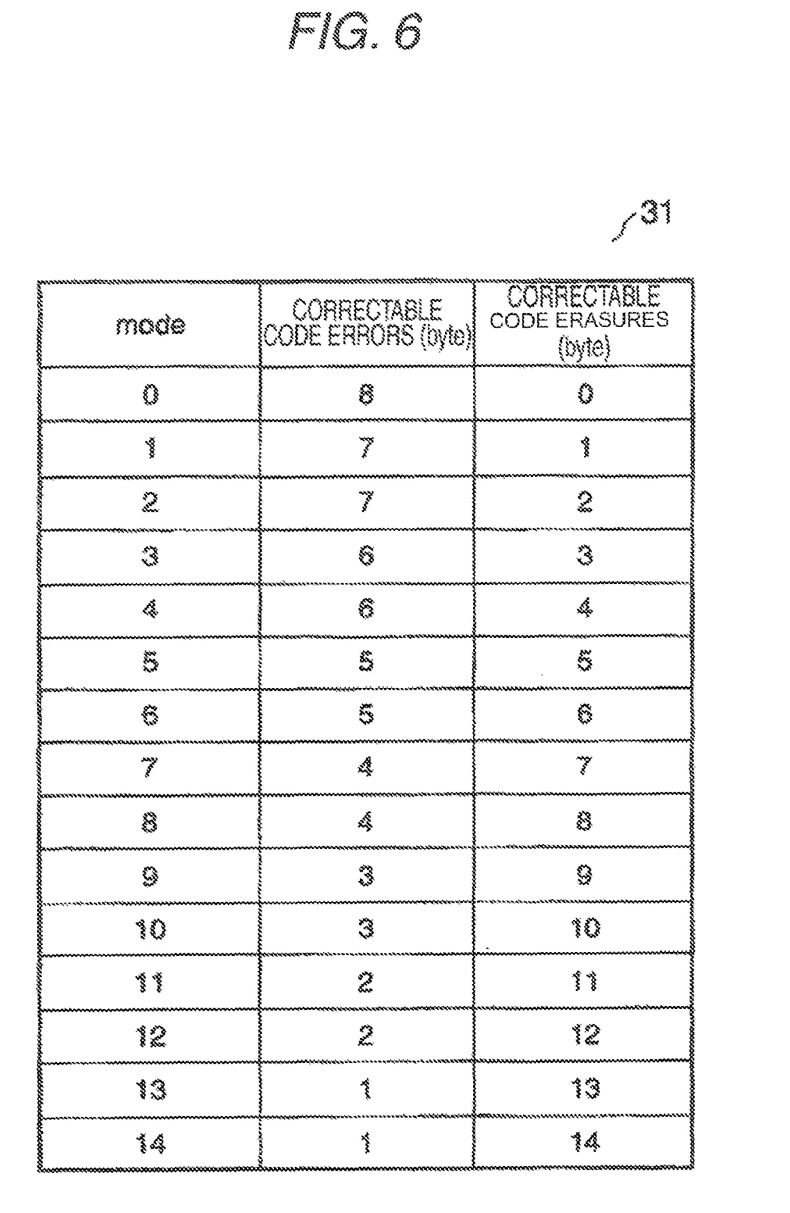
FIG. 6 is a drawing showing an example of the configuration of a correction mode setting unit of the decoder device according to the second embodiment.

FIG. 6 shows an example of a configuration (an example of the format) of the correction mode 32. In the example shown in FIG. 6, 15 (0 to 14) operation modes are provided as the correction mode 32 in units of 255 bytes, and code correction is configured to be capable of a maximum of 8 bytes of errors. In the example, the position (address) of a correctable code is configured to be represented in one byte.

In the second embodiment, it is assumed that a defective cell that is detected to have a code error twice consecutively is treated as "erasure" thereafter.

Generally, an error correction code having a minimum free distance of a code as "dmin" has a correction capability satisfying the relationship of "2t+s+1≦dmin" as described above, where "t" denotes the number of codes correctable by the error correction and "s" denotes the number of codes correctable by the erasure correction. Thus, in the example shown in FIG. 6, a case where the minimum free distance "dmin" of a code is "17" is assumed, and accordingly, 15 correction modes (operation modes 0 to 14) 32 are prepared. For example, in mode 2, code errors of maximum 7 bytes can be corrected by the error correction, while 2 bytes of codes can be corrected by the erasure correction.

When at the very beginning of the usage of the storage medium 20, error history does not exist. Thus, in such a case, the decoder device 10' may be configured to set the correction mode 32 to "mode 0," in which the correctable erasure is minimum (0 bytes) and the correctable code error is maximum (8 bytes). Alternatively, the decoder device 10' may be configured that the correction mode 32 is set to a default mode that is selected from among the fifteen modes based on a result of a test for the storage medium 20 that is performed before the shipment of the storage medium 20.

In the following description, it is assumed that defective cells of 2 bytes are detected in the storage medium 20 in a test before the shipment. In addition, it is assumed that "mode 2," in which defective cells of 2 bytes are treated as "erasure", is selected as the default mode.

Herein, it is assumed that the correction mode setting unit 31 is notified of the existence of defective cells, in which a code error occurs repeatedly, as the storage medium 20 is continuously used, by the error history data 26 output from the error correction history storing unit 14'. For example, it is assumed that a code error occurs consecutively twice in a same cell of the storage medium 20. Then, the correction mode setting unit 31 regards the defective cell in which the code error has occurred twice as "erasure" and changes the correction mode 32 for the next decoding process and decoding processes thereafter to "mode 3," in which erasure correction of 3 bytes and error correction of 6 bytes can be made.

Similarly, every time a defective cell in which a code error occurs frequently is detected, the correction mode setting unit 31 treats the defective cell as "erasure" and appropriately changes the operation mode of the decoding unit 12.

Figure 7:
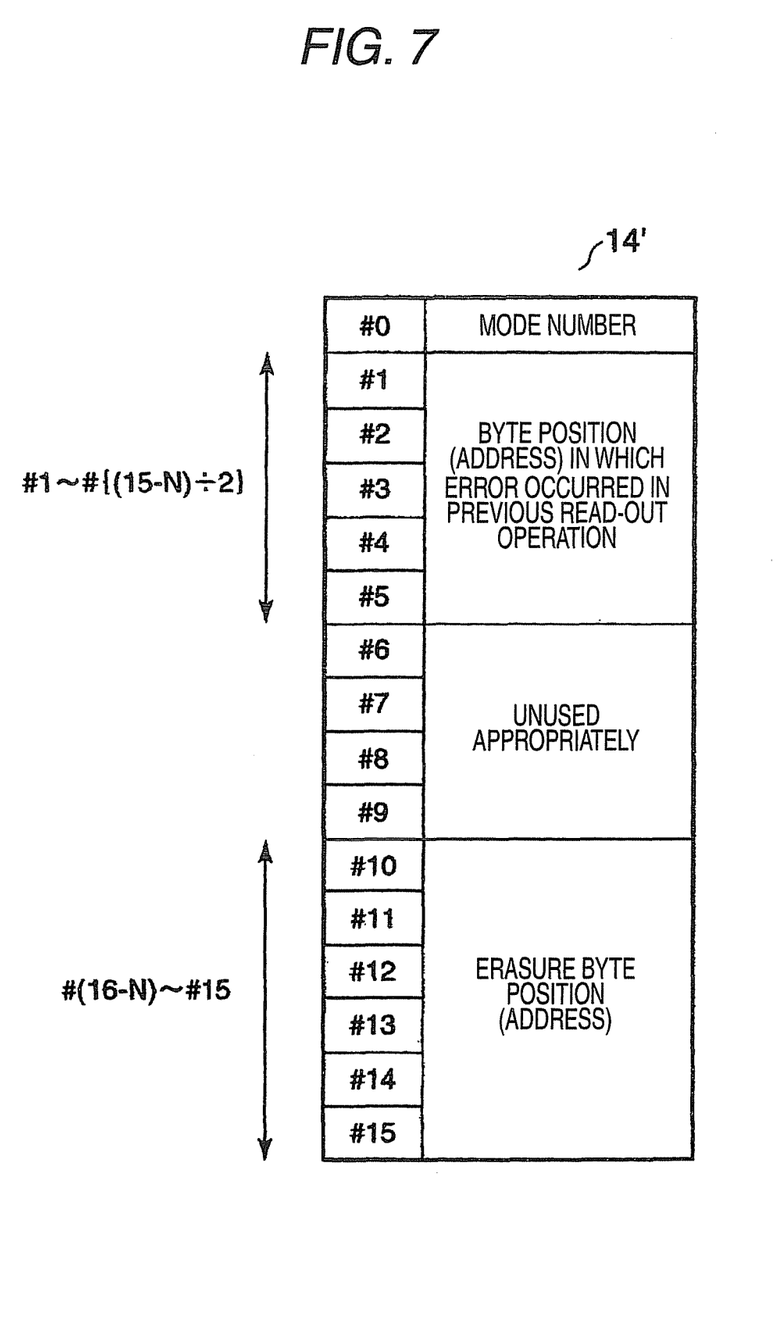
FIG. 7 is a drawing showing an example of the configuration of an error correction history storing unit of the decoder device according to the second embodiment.

FIG. 7 shows an example of a configuration of the error correction history storing unit 14'. In the example shown in FIG. 7, it is assumed that the error correction history storing unit 14' is configured to have a capacity of 16 bytes. Of the 16 bytes of memory area provided in the error correction history storing unit 14', first one byte (#0) is assigned for storing a mode number, and the remaining 15 bytes (#1 to #15) are used for storing the positions (addresses) of the defective cells. In the error correction history storing unit 14', usage of the 15 bytes (#1 to #15), in which the positions (addresses) of the defective cells are stored, is different in each of the correction modes as described below.

For example, when the correction mode 32 is set to "mode 0," a mode number of "0" is stored in the 1st byte (#0), and positions (addresses) of the defective cells in which a code error occurred in the previous read-out operation are stored in the 2nd to 9th bytes (#1 to #8). The 10th to 16th bytes (#9 to #15) are configured to be unused in "mode 0."

While operating in "mode 0," when a code error occurs consecutively twice in two of the defective cells among the defective cells whose address are stored in the 2nd to 9th bytes (#1 to #8), the addresses of the defective cells (erasure codes), which are detected to have the code erasure, are stored in the 15th and 16th bytes (#14 and #15), and a mode number of "2" is stored in the 1st byte (#0). Accordingly, the correction mode 32 is set to "mode 2."

When the correction mode 32 is set to "mode 2," positions (addresses) of the defective cells in which a code error occurred in the previous read-out operation are stored in the 2nd to 8th bytes (#1 to #7), while the positions (addresses) of defective cells that is determined as "erasure" are stored in the 15th and 16th bytes (#14 and #15). The 9th to 14th bytes (#8 to #13) are configured to be unused in "mode 2."

While operating in "mode 2," when a code error occurs consecutively twice in three of the defective cells among the defective cells whose addresses are stored in the 2nd to 8th bytes (#1 to #7), the addresses of the defective cells (erasure codes), which are detected to have the code erasure, are stored in the 12th to 14th bytes (#11 and #13) and a mode number of "6" is stored in the 1st byte (#0). Accordingly, the correction mode 32 is set to "mode 6."

When the correction mode 32 is set to "mode 6," as shown in FIG. 7, the positions (addresses) of the defective cells in which a code error occurred in the previous read-out operation are stored in the 2nd to 6th bytes (#1 to #5), and the positions (addresses) of defective cells that is determined as "erasure" are stored in the 11th to 16th bytes (#10 to #15). The 7th to 10th bytes (#6 to #13) are configured to be unused in "mode 6."

For example, when the correction mode 32 is set to "mode 12," a mode number of "12" is stored in the 1st byte (#0), and the positions (addresses) of defective cells in which a code error occurred in the previous read-out operation are stored in the 2nd and 3rd bytes (#1 and #2) while the positions (addresses) of defective cells that is determined as "erasure" are stored in the 5th to 16th bytes (#4 to #15). The 4th byte (#3) is configured to be unused in "mode 12."

While operating in "mode 12," when a code error occurs consecutively twice in two of the defective cells among the defective cells whose addresses are stored in the 2nd and 3rd bytes (#1 and #2), the addresses of the defective cells (erasure codes), which are detected to have the code erasure, are stored in the 3rd and 4th bytes (#2 and #3) and a mode number of "14" is stored in the $1^{st}$ byte (#0). Accordingly, the correction mode 32 is set to "mode 14."

In "mode 14," a mode number of "14" is stored in the 1st byte (#0), the position (address) of a defective cell in which a code error occurred in the previous read-out operation is stored in the 2nd byte (#1), and the positions (addresses) of defective cells that are determined as "erasure" are stored in the 3rd to 16th (#2 to #15).

The decoder device 10' according to the second embodiment is configured to output a warning signal when a code error occurs consecutively twice in the defective cell stored in the 2nd byte (#1) while operating in "mode 14". Accordingly, the decoder device 10' can notify to a peripheral devices that are connected to the decoder device 10' or to the user that the number of defective cells in the storage medium 20 has reached to a threshold number, to thereby avoid a malfunction of the decoder device 10' and the peripheral devices.

As described above, according to the decoder device 10' thus configured, allowable number of defective cells can be increased by setting erasure codes based on the history of the preceding decoding process for decoding an error correction code and appropriately changing the operation mode. In particular, when the correction mode 32 is fixedly set to "mode 0," defective cells of only 8 bytes are allowable. On the contrary, by performing the correction process as described above, the correction mode 32 can be set in a regularly optimized manner. For example, when the correction mode 32 is reset to be "mode 14," defective cells of 15 bytes becomes allowable.

In the decoder device 10', the decoding unit 12 serves as a decoder that decodes data stored in the storage medium 20 while performing error correction on the data, the error correction being capable of correcting code error and code erasure included in the data. The error correction history storing unit 14 serves as a memory that stores a history of an address in the storage medium 20 of a code included in the data, the code being detected to have the code error by the decoding unit. The correction mode setting unit 31 serves as a controller that controls the decoder to change a detail of the error correction based on the history stored in the memory.

In the above-described decoder devices 10 and 10', there are limits for the numbers of the erasure codes and the error codes that are correctable (allowable) by using the error correction code. When the decoding process is performed for the number of the erasure codes or the error that exceeds the limit, an erroneous decoded data may be output. Thus, the decoder device 10 according to the first embodiment may also be configured to output a warning signal as described in the second embodiment when the decoding process is performed for the number of erasure codes and the error codes that are configured to be allowable. According to such configuration, as described for the decoder device 10' in the second embodiment, the decoder device 10 can avoid a malfunction of the decoder device 10 and the peripheral devices.

The decoder devices 10 and 10' may be implemented as a NAND controller that is provided in a storage device having a NAND-type flash memory and controls data access to the flash memory.

As described above, the decoder devices 10 and 10' are configured to optimize the detail of the error correction in accordance with the aged deterioration of the storage medium 20 by appropriately distributing the processing power of the decoding unit 12 for the correction of the code errors and for the correction of the code erasures. Accordingly, the error correction process can be kept simplified, and the amount of calculation required for the error correction process can be reduced, thereby reducing manufacturing cost and power consumption of the product implemented with the decoder devices 10 and 10'.

In addition, the decoder devices 10 and 10' maximize the product cycle of the storage medium 20 by applying erasure correction in the error correction process as a countermeasure to the aged deterioration of the storage medium 20. Since the error correction process is only performed when accessing the storage medium 20 to readout data, the product cycle of the storage medium 20 can be maximized without modifying any conventional write access procedure.

In the above description, examples where the present invention is applied to a decoder device for a storage medium such as a NAND-type flash memory. However, the present invention is not limited thereto. For example, the present invention can be applied to various decoder apparatus that uses an error correction code.

The storage medium 20 may not be limited to NAND-type flash memory, and various types of storage devices can be used as the storage medium 20. However, the decoder device according to the embodiments is particularly advantageous to be used with the storage medium 20 that has a characteristic that the errors included in the readout data tend to increase as the hours of use increases due to aged deterioration.

In the above description, the data stored in the storage medium 20 is described to be read as an analogue voltage value, however, the data stored in the storage medium 20 may be read as a current value or a digital signal.

In a case where the data stored in the storage medium 20 is read as a digital signal by the decoder device 10', the determination unit 11 may be omitted.

It is to be understood that the present invention is not limited to the specific embodiments described above and that the present invention can be embodied with the components modified without departing from the spirit and scope of the present invention. The present invention can be embodied in various forms according to appropriate combinations of the components disclosed in the embodiments described above. For example, some components may be deleted from the configurations as described as the embodiments. Further, the components in different embodiments may be used appropriately in combination.

What is claimed is:

1. A decoder device comprising:
    a decoder that decodes data stored in a storage medium and performs error correction on the data, the error correction being capable of correcting a code error and code erasure detected in a code included in the data, wherein the decoder detects that the code has the code error or the code erasure;
    a memory that stores, in the storage medium, a history of one or more addresses of the code included in the data; and
    a controller that controls the decoder to change a correction mode of the error correction based on the history stored in the memory.

2. The decoder device according to claim 1, further comprising a determination unit that determines an accuracy of respective codes included in the data read out from the storage medium and generates supplemental information that indicates the accuracy,
    wherein the controller sets erasure information based on the history stored in the memory and the supplemental information generated by the determination unit, the erasure information indicating whether the data read out from the storage medium includes a code to be treated as the code erasure in the error correction performed by the decoder, and
    wherein the decoder performs the error correction in accordance with the erasure information set by the controller.

3. The decoder device according to claim 2, wherein the determination unit determines the accuracy of the respective codes by determining whether each of the respective codes has an analogue value that is in a predetermined range from a threshold value.

4. The decoder device according to claim 1, wherein the decoder selects the correction mode from a plurality of correction modes to perform the error correction, the plurality of correction modes having respective correction capabilities for the code error and the code erasure different from one another, and
    wherein the controller selects the correction mode based on the history stored in the memory and controls the decoder to operate in the correction mode.

5. The decoder device according to claim 1, wherein the decoder performs the error correction that satisfies a following relational expression (1), where "dmin" denotes a minimum free distance of respective codes included in the data, "t" denotes a number of code errors capable of correction, and "s" denotes a number of code erasures capable of correction $$2t+s+1 \leq d\text{min} \qquad (1).$$

6. The decoder device according to claim 1, wherein the storage medium is a NAND-type flash memory.

7. A method for decoding data stored in a storage medium, the method comprising:
    decoding the data stored in the storage medium;
    performing error correction on the data that corrects the at least one of the code error or the code erasure;
    storing, in the storage medium, a history of one or more addresses of the code included in the data; and
    controlling a correction mode of the error correction based on the history.

8. The method according to claim 7 further comprising:
    determining an accuracy of respective codes included in the data read out from the storage medium;
    generating supplemental information that indicates the accuracy; and
    setting an erasure information based on the history and the supplemental information, the erasure information indicating whether the data read out from the storage medium includes a code to be treated as the code erasure in the error correction, and wherein the error correction is performed in accordance with the erasure information.

9. The method according to claim 8, wherein the accuracy of the respective codes is determined by determining whether each of the respective codes has an analogue value that is in a predetermined range from a threshold value.

10. The method according to claim 7, wherein the controlling the correction mode comprises selecting the correction mode from a plurality of correction modes, the plurality of correction modes having respective correction capabilities for the code error and the code erasure different from one another, wherein the correction mode is selected based on the history.

11. The method according to claim 7, wherein the error correction satisfies a following relational expression (2), where "dmin" denotes a minimum free distance of respective codes included in the data, "t" denotes a number of code errors capable of correction, and "s" denotes a number of code erasures capable of correction $$2t+s+1 \leq d\mathrm{min} \qquad (2).$$

12. The method according to claim 7, wherein the storage medium is a NAND-type flash memory.

* * * * *